United States Patent
Kuo

(10) Patent No.: US 10,700,647 B2
(45) Date of Patent: Jun. 30, 2020

(54) SOURCE FOLLOWER

(71) Applicant: MEDIATEK INC., Hsin-Chu (TW)

(72) Inventor: Che-Hsun Kuo, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/589,085

(22) Filed: Sep. 30, 2019

(65) Prior Publication Data

US 2020/0036347 A1    Jan. 30, 2020

Related U.S. Application Data

(63) Continuation of application No. 15/810,942, filed on Nov. 13, 2017.

(60) Provisional application No. 62/431,459, filed on Dec. 8, 2016.

(51) Int. Cl.
*H03F 3/16*      (2006.01)
*H03F 1/32*      (2006.01)
*H03F 3/345*     (2006.01)
*H03F 1/02*      (2006.01)
*H03F 3/193*     (2006.01)

(52) U.S. Cl.
CPC ......... *H03F 1/3205* (2013.01); *H03F 1/0233* (2013.01); *H03F 1/0255* (2013.01); *H03F 3/193* (2013.01); *H03F 3/345* (2013.01); *H03F 2200/102* (2013.01); *H03F 2200/66* (2013.01); *H03F 2200/69* (2013.01)

(58) Field of Classification Search
CPC .................................... H03F 3/04; H03F 3/16
USPC ......................................... 330/277, 297, 296
See application file for complete search history.

(56) References Cited

U.S. PATENT DOCUMENTS

| 4,459,553 A * | 7/1984 | Diller ............. H03F 3/505 330/149 |
| 4,646,002 A | 2/1987 | Tuszyski |
| 5,254,956 A | 10/1993 | Nishijima |
| 5,874,840 A | 2/1999 | Bonaccio |
| 7,088,393 B1 | 8/2006 | Park |
| 2010/0327944 A1 | 12/2010 | Lei |

FOREIGN PATENT DOCUMENTS

| EP | 0561336 A1 | 9/1993 |
| EP | 0618673 A2 | 10/1994 |
| JP | 63199507 A | 8/1988 |

(Continued)

OTHER PUBLICATIONS

Xianping Fan et al.,"Analysis and Design of Low-Distortion CMOS Source Followers", IEEE Transactions on Circuits and Systems—I: Regular Papers, vol. 52, No. 8, pp. 1489-1501, Aug. 2005.

*Primary Examiner* — Steven J Mottola
(74) *Attorney, Agent, or Firm* — Winston Hsu

(57) ABSTRACT

A source follower with an input node and an output node includes a first transistor, a second transistor, and a DC (Direct Current) tracking circuit. The first transistor has a control terminal, a first terminal coupled to a first node, and a second terminal coupled to a second node. The second transistor has a control terminal, a first terminal coupled to a ground voltage, and a second terminal coupled to the first node. The DC tracking circuit sets the second DC voltage at the second node to a specific level. The specific level is determined according to the first DC voltage at the first node. The output node of the source follower is coupled to the first node.

9 Claims, 10 Drawing Sheets

(56) References Cited

FOREIGN PATENT DOCUMENTS

| | | | |
|---|---|---|---|
| JP | 2002353743 | A | 12/2002 |
| JP | 2015122685 | A | 7/2015 |

\* cited by examiner

SOURCE FOLLOWER

CROSS REFERENCE TO RELATED
APPLICATION

This application is a Continuation of and claims the benefit of priority to U.S. patent application Ser. No. 15/810,942, filed on 2017 Nov. 13, which claims the benefit of priority of U.S. provisional application Ser. No. 62/431,459, filed on 2016 Dec. 8, which are entirely incorporated herein by reference.

BACKGROUND

The disclosure generally relates to a source follower, and more specifically, to a source follower for suppressing second harmonic distortion.

Conventionally, a single-input-ended source follower is very sensitive to PVT (Process, Voltage, and Temperature) variations, which are the result of second harmonic distortion relative to the source follower. The second harmonic distortion becomes worse when the variations of drain-to-source voltage of the input transistor and the current source are not symmetry to output-common mode voltage. Serious second harmonic distortion may degrade the linearity of the source follower, thereby negatively affecting its performance. Accordingly, there is a need to propose a novel solution to the problems with the prior art.

SUMMARY

In an embodiment, the disclosure is directed to a source follower with an input node and an output node, and the source follower includes a first transistor, a second transistor, and a DC (Direct Current) tracking circuit. The first transistor has a control terminal, a first terminal coupled to a first node, and a second terminal coupled to a second node. The second transistor has a control terminal, a first terminal coupled to a ground voltage, and a second terminal coupled to the first node. The DC tracking circuit sets a second DC voltage at the second node to a specific level. The specific level is determined according to a first DC voltage at the first node. The output node of the source follower is coupled to the first node.

In some embodiments, the second DC voltage is substantially equal to two times the first DC voltage.

In some embodiments, the DC tracking circuit is implemented with an open-loop operational amplifier, a closed-loop operational amplifier, or a linear regulator.

In some embodiments, the input node of the source follower is coupled to the control terminal of the first transistor, and a bias voltage is coupled to the control terminal of the second transistor.

In some embodiments, the first transistor and the second transistor are NMOS transistors (N-type Metal-Oxide-Semiconductor Field-Effect Transistors).

In some embodiments, the DC tracking circuit includes a first operational amplifier, a third transistor, a fourth transistor, a first resistor, a second resistor, and a second operational amplifier. The first operational amplifier has a positive input terminal for receiving a first DC reference voltage, a negative input terminal coupled to a third node, and an output terminal coupled to a fourth node. The third transistor has a control terminal coupled to the fourth node, a first terminal coupled to a fifth node, and a second terminal coupled to a supply voltage. The fourth transistor has a control terminal coupled to the fourth node, a first terminal coupled to the second node, and a second terminal coupled to the supply voltage. The first resistor is coupled between the fifth node and the third node. The second resistor is coupled between the third node and the ground voltage. The second operational amplifier has a positive input terminal for receiving the first DC reference voltage, a negative input terminal for receiving a second DC reference voltage, and an output terminal coupled to the input node of the source follower.

In some embodiments, both the first DC voltage and the second DC reference voltage are equal to the first DC reference voltage.

In some embodiments, the third transistor and the fourth transistor are NMOS transistors (N-type Metal-Oxide-Semiconductor Field-Effect Transistors).

In some embodiments, a DC component of an output voltage at the output node of the source follower is fed back to the second DC reference voltage.

In some embodiments, the input node of the source follower is coupled to the control terminal of the second transistor, and a bias voltage is coupled to the control terminal of the first transistor.

In some embodiments, the first transistor and the second transistor are PMOS transistors (P-type Metal-Oxide-Semiconductor Field-Effect Transistors).

In another preferred embodiment, the invention is directed to a source follower with an input node and an output node, and the source follower includes a first transistor, a second transistor, and a DC (Direct Current) tracking circuit. The first transistor has a control terminal, a first terminal coupled to a first node, and a second terminal coupled to a supply voltage. The second transistor has a control terminal, a first terminal coupled to a second node, and a second terminal coupled to the first node. The DC tracking circuit sets the second DC voltage at the second node to a specific level. The specific level is determined according to the first DC voltage at the first node. The output node of the source follower is coupled to the first node.

In some embodiments, the second DC voltage is substantially equal to two times the first DC voltage minus the supply voltage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The invention can be more fully understood by reading the subsequent detailed description and examples with references made to the accompanying drawings, wherein.

DETAILED DESCRIPTION

In order to illustrate the purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
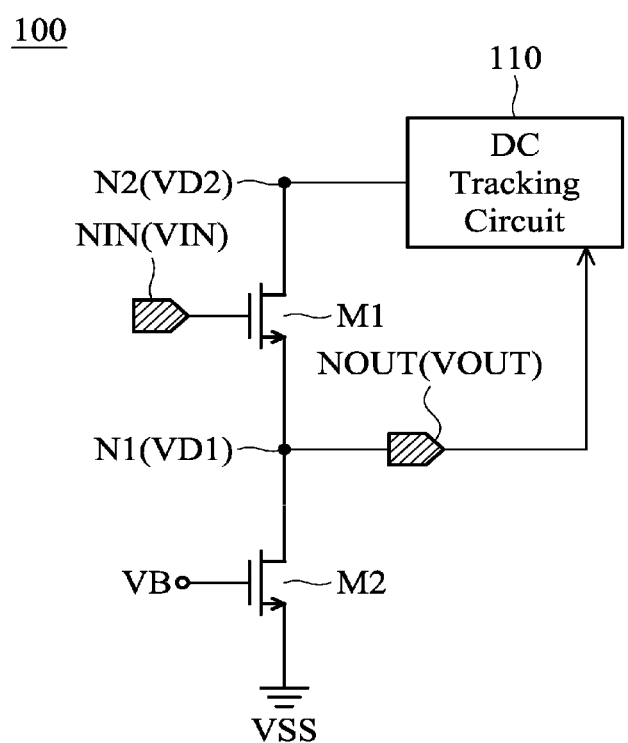
FIG. 1 is a diagram of a source follower according to an embodiment of the invention.

FIG. 1 is a diagram of a source follower 100 according to an embodiment of the invention. As shown in FIG. 1, the source follower 100 with an input node NIN and an output node NOUT includes a first transistor M1, a second transistor M2, and a DC (Direct Current) tracking circuit 110. The input node NIN of the source follower 100 is arranged for receiving an input voltage VIN, and the output node NOUT of the source follower 100 is arranged for outputting an output voltage VOUT. Generally, the waveform of the output voltage VOUT substantially follows the waveform of the input voltage VIN.

In the embodiment of FIG. 1, the first transistor M1 and the second transistor M2 are NMOS transistors (N-type Metal-Oxide-Semiconductor Field-Effect Transistors). The first transistor M1 and the second transistor M2 may have the same transistor sizes. The first transistor M1 has a control terminal, a first terminal coupled to a first node N1, and a second terminal coupled to a second node N2. The input node NIN of the source follower 100 is coupled to the control terminal of the first transistor M1, and the output node NOUT of the source follower 100 is coupled to the first node N1, such that the first transistor M1 is used as an input transistor. The second transistor M2 has a control terminal, a first terminal coupled to a ground voltage VSS, and a second terminal coupled to the first node N1. A bias voltage VB is coupled to the control terminal of the second transistor M2, such that the second transistor M2 is used as a current source. The DC tracking circuit 110 sets a second DC voltage VD2 at the second node N2 to a specific level. For example, the specific level may be constant or dynamic. The specific level is determined by the DC tracking circuit 110 according to a first DC voltage VD1 at the first node N1.

In some embodiments, the second DC voltage VD2 is substantially equal to two times the first DC voltage VD1, and their relationship is expressed as the equation (1).

$$VD2=2 \cdot VD1 \quad (1)$$

where the symbol "VD1" represents the voltage level of the first DC voltage VD1, and the symbol "VD2" represents the voltage level of the second DC voltage VD2.

Figure 2A:
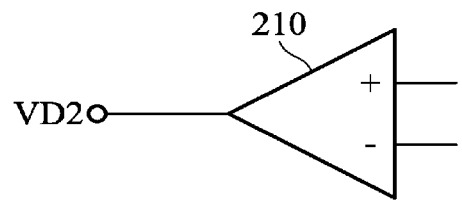
FIG. 2A is a diagram of an open-loop operational amplifier according to an embodiment of the invention.
Figure 2B:
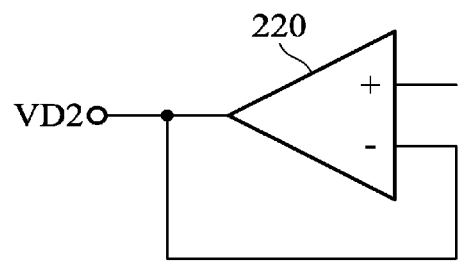
FIG. 2B is a diagram of a closed-loop operational amplifier according to an embodiment of the invention.
Figure 2C:
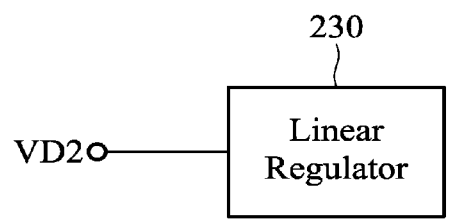
FIG. 2C is a diagram of a linear regulator according to an embodiment of the invention.

The DC tracking circuit 110 may have a plurality different configurations. FIG. 2A is a diagram of an open-loop operational amplifier 210 according to an embodiment of the invention. FIG. 2B is a diagram of a closed-loop operational amplifier 220 according to an embodiment of the invention. FIG. 2C is a diagram of a linear regulator 230 according to an embodiment of the invention. The aforementioned amplifiers and regulator can clamp the second DC voltage VD2 to a specific level. For example, the DC tracking circuit 110 may be implemented with the open-loop operational amplifier 210, the closed-loop operational amplifier 220, or the linear regulator 230, as shown in FIG. 2A, FIG. 2B, and FIG. 2C, but it is not limited thereto. Accordingly, the second DC voltage VD2 is determined in response to the first DC voltage VD1.

Figure 3:
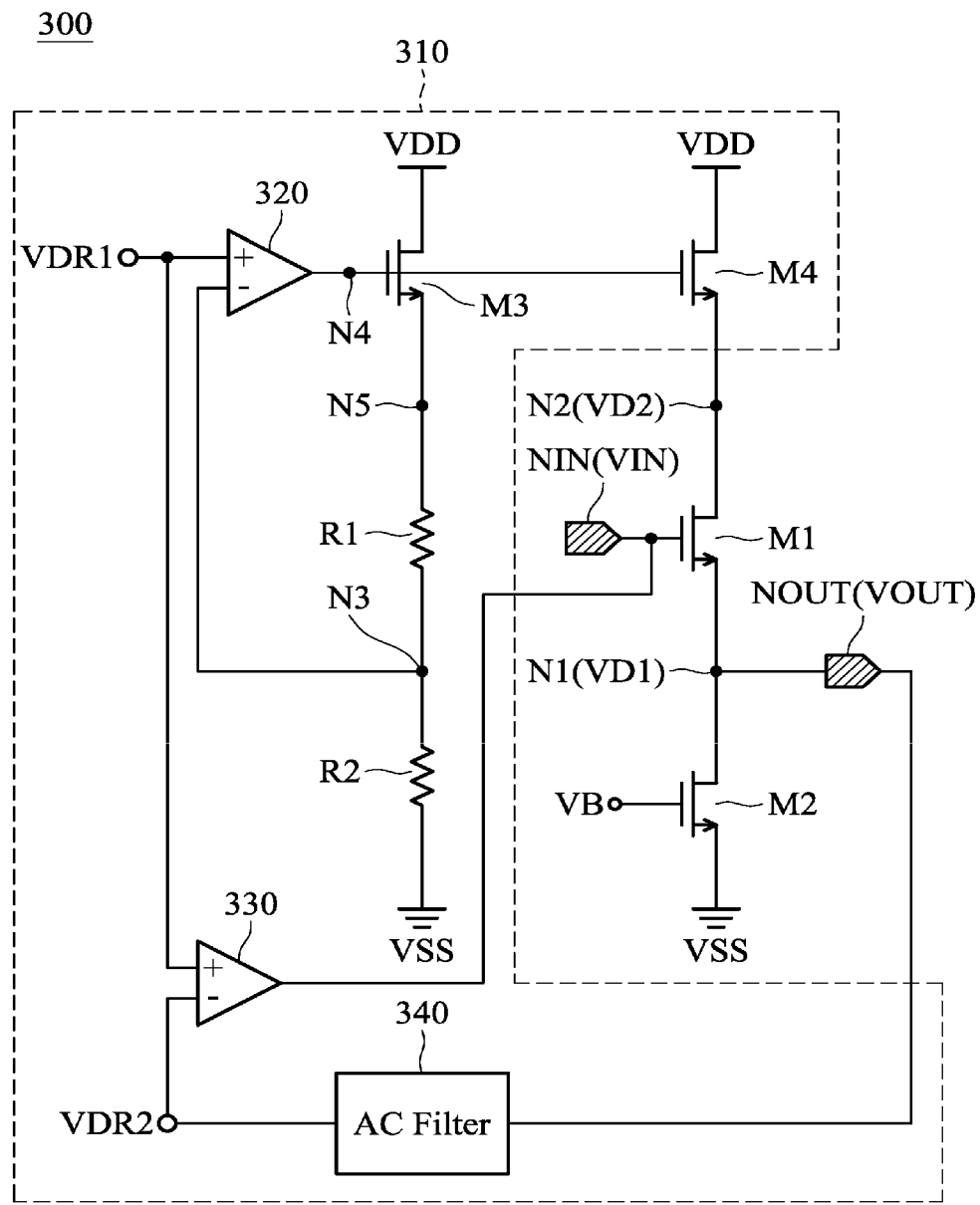
FIG. 3 is a diagram of a source follower according to an embodiment of the invention.

FIG. 3 is a diagram of a source follower 300 according to an embodiment of the invention. In the embodiment of FIG. 3, the source follower 300 includes a first transistor M1, a second transistor M2, and a DC tracking circuit 310, which is implemented with a regulator including two operational amplifiers. The arrangements and functions of the first transistor M1 and the second transistor M2 have been described in the embodiment of FIG. 1. The DC tracking circuit 310 can determine the second DC voltage VD2 according to the first DC voltage VD1, as mentioned above. Specifically, the DC tracking circuit 310 includes a first operational amplifier 320, a second operational amplifier 330, a third transistor M3, a fourth transistor M4, a first resistor R1, and a second resistor R2. The third transistor M3 and the fourth transistor M4 may be NMOS transistors (N-type Metal-Oxide-Semiconductor Field-Effect Transistors). The first operational amplifier 320 has a positive input terminal for receiving a first DC reference voltage VDR1, a negative input terminal coupled to a third node N3, and an output terminal coupled to a fourth node N4. The third transistor M3 has a control terminal coupled to the fourth node N4, a first terminal coupled to a fifth node N5, and a second terminal coupled to a supply voltage VDD. The fourth transistor M4 has a control terminal coupled to the fourth node N4, a first terminal coupled to the second node N2, and a second terminal coupled to the supply voltage VDD. The first resistor R1 and the second resistor R2 may have the same resistance. The first resistor R1 is coupled between the fifth node N5 and the third node N3. The second resistor R2 is coupled between the third node N3 and the ground voltage VSS. The second operational amplifier 330 has a positive input terminal for receiving the first DC reference voltage VDR1, a negative input terminal for receiving a second DC reference voltage VDR2, and an output terminal coupled to the input node NIN of the source follower 300. Both the first DC voltage VD1 at the first node N1 and the second DC reference voltage VDR2 may be equal to the first DC reference voltage VDR1 due to close-loop. In some embodiments, the DC tracking circuit 310 further includes an AC (Alternating Current) filter 340 (optional element), and the output node NOUT of the source follower 300 is fed back through the AC filter 340 to the second DC reference voltage VDR2. As a result, the second DC reference voltage VDR2 may include only a DC component of the output voltage VOUT, and an AC component of the output voltage VOUT is completely removed by the AC filter 340.

Figure 4:
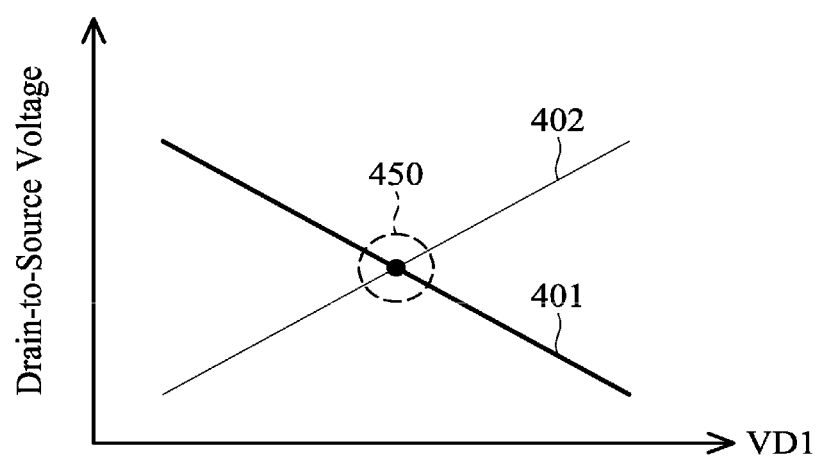
FIG. 4 is a diagram of the relationship between drain-to-source voltages of transistors and a first DC (Direct Current) voltage according to an embodiment of the invention.

FIG. 4 is a diagram of the relationship between the drain-to-source voltages of transistors and the first DC voltage VD1 according to an embodiment of the invention. As shown in FIG. 4, the first curve 401 represents the drain-to-source voltage of the first transistor M1, and the second curve 402 represents the drain-to-source voltage of the second transistor M2. According to the measurement of FIG. 4, if the first DC voltage VD1 becomes higher, the drain-to-source voltage of the first transistor M1 will decrease, but the drain-to-source voltage of the second transistor M2 will increase; conversely, if the first DC voltage VD1 becomes lower, the drain-to-source voltage of the first transistor M1 will increase, but the drain-to-source voltage of the second transistor M2 will decrease. That is, the total drain-to-source voltage of the first transistor M1 and the second transistor M2 are substantially maintained at a relatively constant level. At the intersection point 450 of the first curve 401 and the second curve 402, the first transistor M1 and the second transistor M2 can have the same drain-to-source resistances. Please refer to the embodiment of FIG. 1 again. By using the DC tracking circuit 110 to clamp the second DC voltage VD2, a first DC voltage difference (i.e., VD2−VD1=VD1) across the first transistor M1 can be substantially equal to a second DC voltage difference (i.e., VD1−VSS=VD1) across the second transistor M2. Since the variations in the drain-to-source voltages of the first transistor M1 and the second transistor M2 are nearly symmetry to the output-common mode voltage (i.e., the first DC voltage VD1 at the first node), the second harmonic distortion relative to the source follower 100 can almost be eliminated.

Figure 5A:
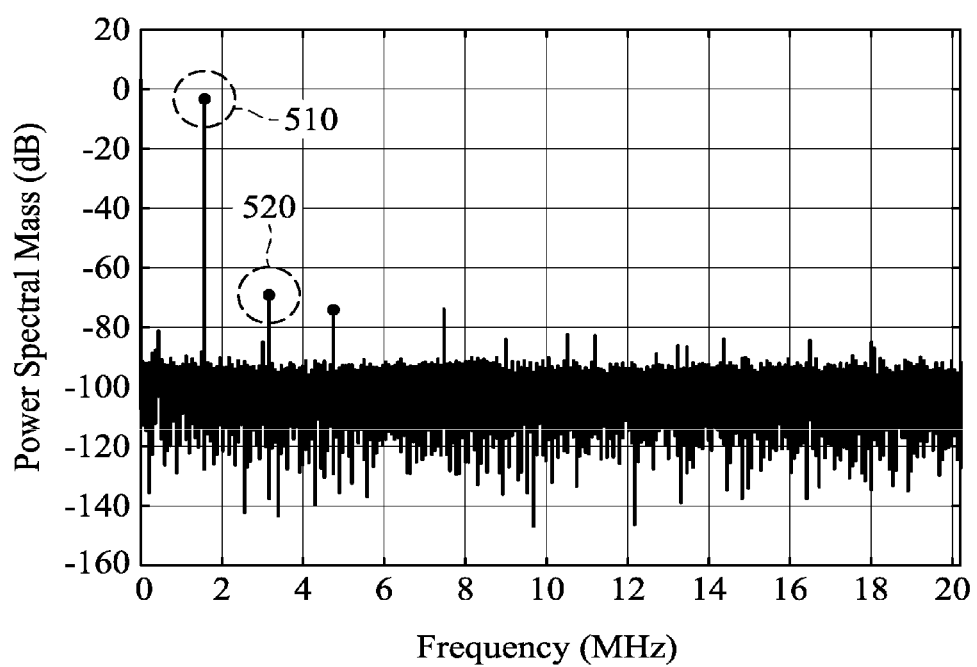
FIG. 5A is a diagram of power spectral mass of a source follower without any DC tracking circuit
Figure 5B:
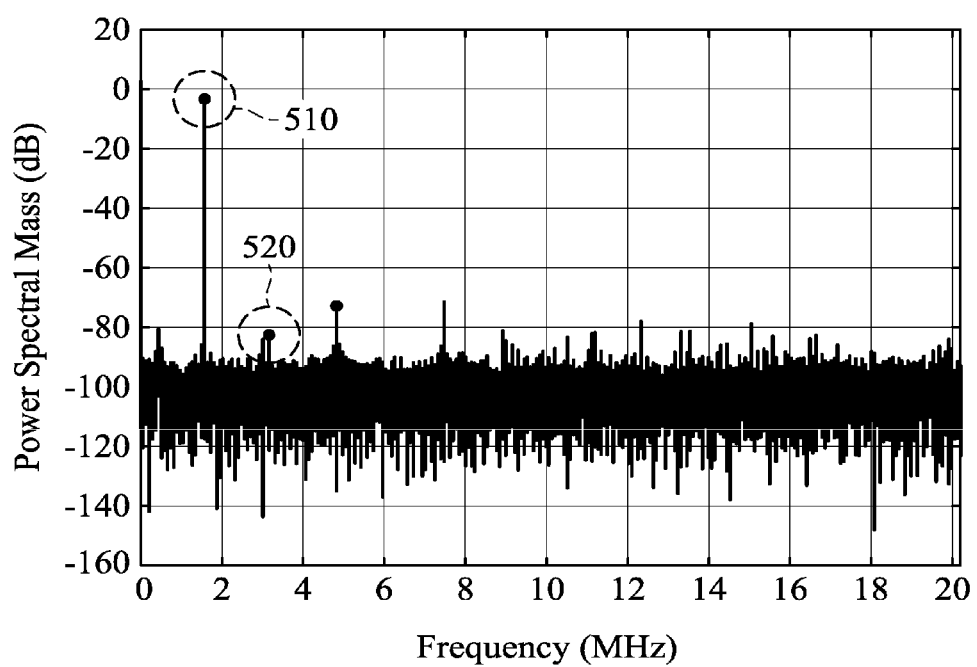
FIG. 5B is a diagram of power spectral mass of a source follower with a DC tracking circuit according to an embodiment of the invention.
Figure 5C:
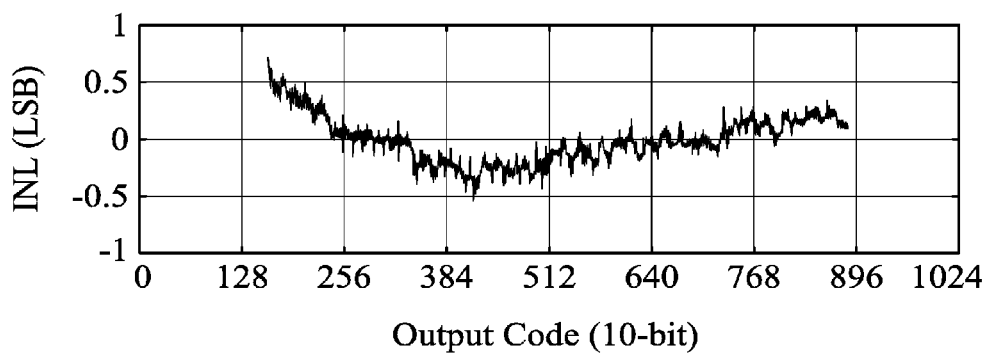
FIG. 5C is a diagram of INL (Integral Non-Linearity) of a source follower without any DC tracking circuit.
Figure 5D:
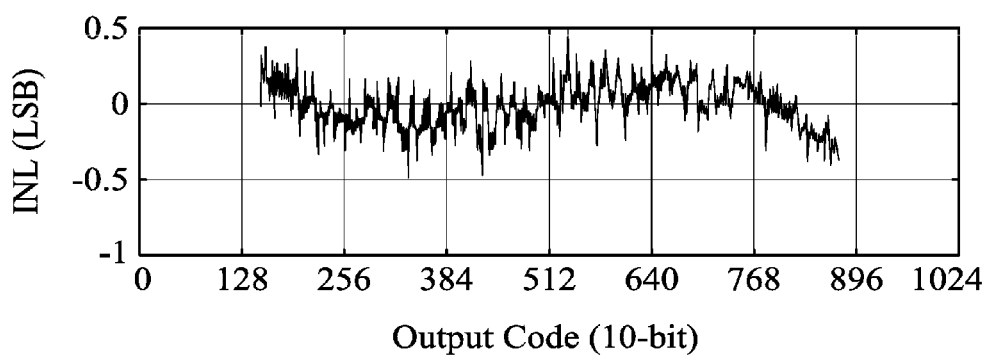
FIG. 5D is a diagram of INL of a source follower with a DC tracking circuit according to an embodiment of the invention

FIG. 5A is a diagram of power spectral mass of a source follower without any DC tracking circuit. FIG. 5B is a diagram of power spectral mass of the source follower 100 with the DC tracking circuit 110 according to an embodiment of the invention. The horizontal axis represents the operation frequency (MHz), and the vertical axis represents the power spectral mass (dB) relative to the source follower. According to the measurement of FIG. 5A and FIG. 5B, when the DC tracking circuit 110 is applied to the source follower 100, the strength of a second harmonic component 520 (with respect to a fundamental component 510) is significantly suppressed. FIG. 5C is a diagram of INL (Integral Non-Linearity) of a source follower without any DC tracking circuit. FIG. 5D is a diagram of INL of the source follower 100 with the DC tracking circuit 110 according to an embodiment of the invention. Detailed measurement data show further that the THD (Total Harmonic Distortion) improves from 61.96 dB (without the DC tracking circuit 110) to 66.96 dB (with the DC tracking circuit 110), and the INL improves from 0.76 LSB (Least Significant Bit) (without the DC tracking circuit 110, as shown in FIG. 5C) to 0.5 LSB (with the DC tracking circuit 110, as shown in FIG. 5D). Therefore, the proposed source follower 100 with the DC tracking circuit 110 can effectively suppress its second harmonic distortion and enhance its device linearity.

Figure 6:
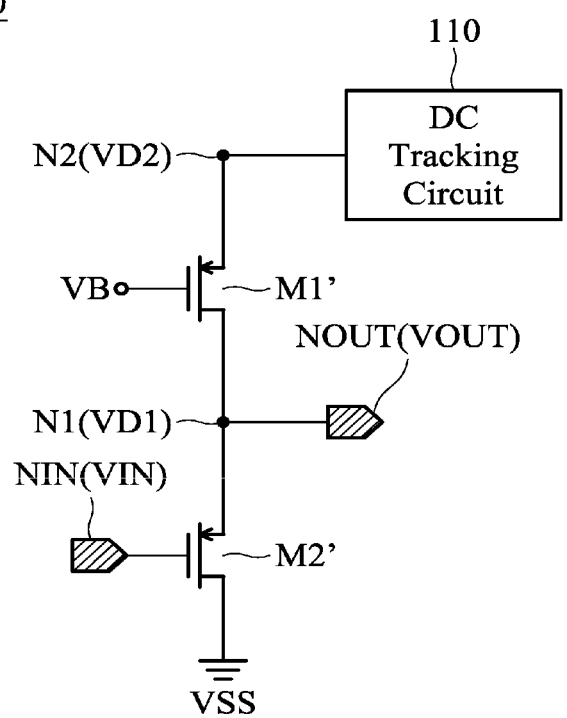
FIG. 6 is a diagram of a source follower according to another embodiment of the invention.

FIG. 6 is a diagram of a source follower 600 according to another embodiment of the invention. FIG. 6 is similar to FIG. 1. In the embodiments of FIG. 6, the source follower 600 includes a first transistor M1' and a second transistor M2' which are PMOS transistors (P-type Metal-Oxide-Semiconductor Field-Effect Transistors). The input node NIN of the source follower 600 is coupled to the control terminal of the second transistor M2', such that the second transistor M2' is used as an input transistor. The bias voltage VB is coupled to the control terminal of the first transistor M1', such that the first transistor M1 is used as a current source. Similarly, the DC tracking circuit 110 can clamp the second DC voltage VD2, and therefore the first DC voltage difference (i.e., VD2−VD1=VD1) across the first transistor M1' can be substantially equal to the second DC voltage difference (i.e., VD1−VSS=VD1) across the second transistor M2'. As a result, the second harmonic distortion relative to the source follower 600 can be almost eliminated. Other features of the source follower 600 of FIG. 6 are similar to those of the source follower 100 of FIG. 1. Accordingly, the two embodiments can achieve similar levels of performance.

Figure 7:
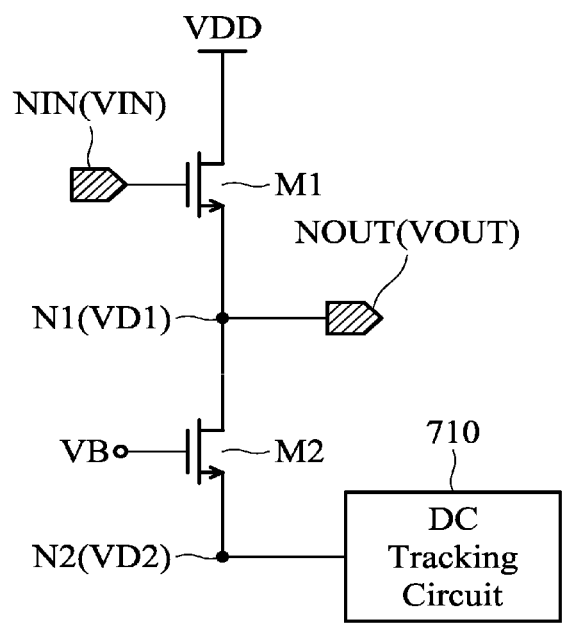
FIG. 7 is a diagram of a source follower according to an embodiment of the invention.

FIG. 7 is a diagram of a source follower 700 according to an embodiment of the invention. As shown in FIG. 7, the source follower 700 with an input node NIN and an output node NOUT includes a first transistor M1, a second transistor M2, and a DC (Direct Current) tracking circuit 710. In the embodiment of FIG. 7, the first transistor M1 and the second transistor M2 are NMOS transistors (N-type Metal-Oxide-Semiconductor Field-Effect Transistors). The first transistor M1 has a control terminal, a first terminal coupled to a first node N1, and a second terminal coupled to a supply voltage VDD. The input node NIN of the source follower 700 is coupled to the control terminal of the first transistor M1, and the output node NOUT of the source follower 700 is coupled to the first node N1, such that the first transistor M1 is used as an input transistor. The second transistor M2 has a control terminal, a first terminal coupled to a second node N2, and a second terminal coupled to the first node N1. A bias voltage VB is coupled to the control terminal of the second transistor M2, such that the second transistor M2 is used as a current source. The DC tracking circuit 710 sets a second DC voltage VD2 at the second node N2 to a specific level. The specific level is determined by the DC tracking circuit 710 according to a first DC voltage VD1 at the first node N1.

In some embodiments, the second DC voltage VD2 is substantially equal to two times the first DC voltage VD1 minus the supply voltage VDD, and their relationship is expressed as the equation (2).

$$VD2=2 \cdot VD1 - VDD \qquad (1)$$

wherein the symbol "VD1" represents the voltage level of the first DC voltage VD1, the symbol "VD2" represents the voltage level of the second DC voltage VD2, and the symbol "VDD" represents the voltage level of the supply voltage VDD.

For the source follower 700, by using the DC tracking circuit 710 to clamp the second DC voltage VD2, a third DC voltage difference (i.e., VDD−VD1) across the first transistor M1 can be substantially equal to a fourth DC voltage difference (i.e., VD1−VD2=VDD−VD1) across the second transistor M2. Since the variation of drain-to-source voltage of first transistor M1 and the second transistor M2 are nearly symmetry to output-common mode voltage, the second harmonic distortion relative to the source follower 700 can almost be eliminated. Other features of the source follower 700 of FIG. 7 are similar to those of the source follower 100 of FIG. 1. Accordingly, the two embodiments can achieve similar levels of performance.

Figure 8:
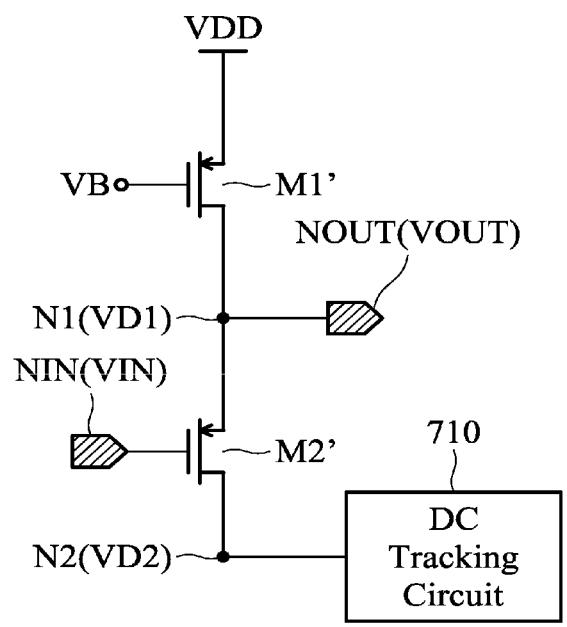
FIG. 8 is a diagram of a source follower according to another embodiment of the invention.

FIG. 8 is a diagram of a source follower 800 according to another embodiment of the invention. FIG. 8 is similar to FIG. 7. In the embodiments of FIG. 8, the source follower 800 includes a first transistor M1' and a second transistor M2' which are PMOS transistors (P-type Metal-Oxide-Semiconductor Field-Effect Transistors). The input node NIN of the source follower 800 is coupled to the control terminal of the second transistor M2', such that the second transistor M2' is used as an input transistor. The bias voltage VB is coupled to the control terminal of the first transistor M1', such that the first transistor M1' is used as a current source. Similarly, the DC tracking circuit 110 can clamp the second DC voltage VD2, and therefore the third DC voltage difference (i.e., VDD−VD1) across the first transistor M1' can be substantially equal to the fourth DC voltage difference (i.e., VD1−VD2=VDD−VD1) across the second transistor M2'. As a result, the second harmonic distortion relative to the source follower 800 can almost be eliminated. Other features of the source follower 800 of FIG. 8 are similar to those of the source follower 700 of FIG. 7. Accordingly, the two embodiments can achieve similar levels of performance.

The invention proposes a novel source follower for suppressing its relative second harmonic distortion. A DC tracking circuit is added and used to equalize the variation of drain-to-source voltage of an input transistor and a current source of the source follower. Such a design keeps the second harmonic distortion at a relatively low level. Accordingly, the proposed source follower of the invention is insensitive to the PVT (Process, Voltage, and Temperature) variations.

Note that the above voltages, currents, resistances, inductances, capacitances and other element parameters are not limitations of the invention. A designer can adjust these parameters according to different requirements. The source follower of the invention is not limited to the configurations of FIGS. 1-8. The invention may merely include any one or more features of any one or more embodiments of FIGS. 1-8. In other words, not all of the features displayed in the figures should be implemented in the source follower.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A source follower, comprising:
    an input transistor, comprising an input terminal, a first terminal coupled to an output node of the source follower, and a second terminal coupled to a DC (Direct Current) tracking circuit; and
    a current source circuit, comprising a control terminal, a first terminal coupled to ground, and a second terminal coupled to the output node;
    wherein the DC tracking circuit is arranged for providing a second voltage to the second terminal of the input transistor, a level of the second voltage is determined according to a DC reference voltage, and a DC voltage of a first voltage at the output node is equal to the DC reference voltage; and the DC tracking circuit further generates a control signal to a control terminal of the input transistor according to the first voltage at the output node.

2. The source follower of claim 1, wherein the DC tracking circuit comprises:
    a first circuit, for receiving the DC reference voltage and a voltage to generate another control signal;
    wherein the second voltage is generated according to the another control signal.

3. The source follower of claim 2, wherein the DC tracking circuit further comprises:
    a second circuit, for receiving the first voltage of the output node and the DC reference voltage to generate the control signal.

4. The source follower of claim 3, wherein the DC tracking circuit further comprises:
    a filter, for filtering the first voltage of the output node to generate a filtered first voltage;
    wherein the second circuit receives the filtered first voltage and the DC reference voltage to generate the control signal.

5. The source follower of claim 3, wherein the first circuit is a first operational amplifier, and the second circuit is a second operational amplifier.

6. The source follower of claim 5, wherein a positive input terminal of the first operational amplifier receives the DC reference voltage, a negative input terminal of the first operational amplifier receives the voltage, a positive input terminal of the second operational amplifier receives the DC reference voltage, and a negative input terminal of the second operational amplifier receives the first voltage of the output node.

7. The source follower of claim 2, wherein the DC tracking circuit further comprises:
    a third circuit, for receiving the another control signal to generate the voltage to the first circuit.

8. The source follower of claim 7, wherein the third circuit comprises:
    a transistor, wherein a control terminal of the transistor receives the another control signal, and a first terminal of the transistor is coupled to a supply voltage; and
    a resistor, wherein a first terminal of the resistor is coupled to a second terminal of the transistor, and a second terminal of the resistor is used to provide the voltage to the second circuit.

9. The source follower of claim 2, wherein the DC tracking circuit further comprises:
    a fourth circuit, coupled to the second circuit, for the receiving the another control signal to generate the second voltage.

* * * * *